United States Patent
Ito et al.

(10) Patent No.: US 9,982,102 B2
(45) Date of Patent: May 29, 2018

(54) PHOTOCURABLE COMPOSITION AND METHOD OF MANUFACTURING FILM USING THE COMPOSITION

(71) Applicant: CANON KABUSHIKI KAISHA, Tokyo (JP)

(72) Inventors: Toshiki Ito, Kawasaki (JP); Chieko Mihara, Isehara (JP); Youji Kawasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 9 days.

(21) Appl. No.: 14/405,929

(22) PCT Filed: Sep. 11, 2013

(86) PCT No.: PCT/JP2013/075211
§ 371 (c)(1),
(2) Date: Dec. 5, 2014

(87) PCT Pub. No.: WO2014/046150
PCT Pub. Date: Mar. 27, 2014

(65) Prior Publication Data
US 2015/0183942 A1    Jul. 2, 2015

(30) Foreign Application Priority Data

Sep. 19, 2012 (JP) ................................. 2012-205551
Feb. 18, 2013 (JP) ................................. 2013-028701

(51) Int. Cl.
*C08F 2/48* (2006.01)
*H01L 21/768* (2006.01)
(Continued)

(52) U.S. Cl.
CPC .............. *C08J 5/18* (2013.01); *B29C 35/0805* (2013.01); *C08F 2/48* (2013.01); *G03F 7/0002* (2013.01);
(Continued)

(58) Field of Classification Search
CPC ........... C08J 5/18; C08J 2333/08; H05K 3/06; H05K 3/0076; H05K 3/0079;
(Continued)

(56) References Cited

U.S. PATENT DOCUMENTS 7,935,472 B2    5/2011   Ogino et al.
8,540,925 B2    9/2013   Kawaguchi et al.
(Continued)

FOREIGN PATENT DOCUMENTS

CN    101151132 A    3/2008
CN    102381000 A    3/2012
(Continued)

OTHER PUBLICATIONS

Shravanthi Reddy et al., "Simulation of Fluid Flow in the Step and Flash Imprint Lithography Process," 82(1) Microelectronic Engineering 60-70 (Jul. 2005).
(Continued)

*Primary Examiner* — Michael F Pepitone
*Assistant Examiner* — Jessica M Roswell
(74) *Attorney, Agent, or Firm* — Fitzpatrick, Cella, Harper & Scinto (57) ABSTRACT

Provided are a photocurable composition having high filling property and capable of reducing a mold release force upon production of a film through the utilization of a photo-imprint method, and a method of manufacturing a film using the photocurable composition. The photocurable composition is a photocurable composition, including at least the following component (A) to component (C): (A) a polym-
(Continued)

erizable compound; (B) a photopolymerization initiator; and (C) a surfactant represented by the following general formula (1):

$$Rf_1-Rc-X. \qquad (1)$$

10 Claims, 3 Drawing Sheets

(51) Int. Cl.
| | |
|---|---|
| *H01L 23/532* | (2006.01) |
| *H05K 3/10* | (2006.01) |
| *C08J 5/18* | (2006.01) |
| *G03F 7/00* | (2006.01) |
| *G03F 7/004* | (2006.01) |
| *G03F 7/027* | (2006.01) |
| *G03F 7/031* | (2006.01) |
| *H05K 3/00* | (2006.01) |
| *H01L 21/02* | (2006.01) |
| *H01L 21/308* | (2006.01) |
| *H01L 21/311* | (2006.01) |
| *B29C 35/08* | (2006.01) |
| *H05K 3/06* | (2006.01) |
| *B29K 33/04* | (2006.01) |
| *B29K 105/00* | (2006.01) |

(52) U.S. Cl.
CPC .......... *G03F 7/0046* (2013.01); *G03F 7/0048* (2013.01); *G03F 7/027* (2013.01); *G03F 7/031* (2013.01); *H01L 21/02118* (2013.01); *H01L 21/3086* (2013.01); *H01L 21/311* (2013.01); *H05K 3/0023* (2013.01); *H05K 3/0076* (2013.01); *H05K 3/0079* (2013.01); *H05K 3/06* (2013.01); *B29C 2035/0827* (2013.01); *B29K 2033/04* (2013.01); *B29K 2105/0005* (2013.01); *B29K 2909/00* (2013.01); *C08J 2333/08* (2013.01); *H05K 3/107* (2013.01); *H05K 2203/0113* (2013.01); *H05K 2203/086* (2013.01); *H05K 2203/087* (2013.01)

(58) Field of Classification Search
CPC ........... H05K 3/0023; H05K 2203/087; H05K 2203/0113; H05K 2203/086; H05K 3/107; B29C 35/0805; B29C 2035/0827; H01L 21/311; H01L 21/3086; G03F 7/0002; G03F 7/027; G03F 7/0048; G03F 7/031; G03F 7/0046; C08F 2/48
See application file for complete search history.

(56) References Cited

U.S. PATENT DOCUMENTS

| | | | |
|---|---|---|---|
| 2006/0111454 | A1 | 5/2006 | Xu et al. |
| 2007/0065757 | A1* | 3/2007 | Ogino .................. B82Y 10/00 430/311 |
| 2009/0057960 | A1 | 3/2009 | Kashiwagi |
| 2013/0049255 | A1* | 2/2013 | Matsumoto ............ B29C 33/58 264/220 |

FOREIGN PATENT DOCUMENTS

| | | |
|---|---|---|
| JP | 5-331339 A | 12/1993 |
| JP | 2000-254405 A | 9/2000 |
| JP | 2003-105207 A | 4/2003 |
| JP | 2005-103893 A | 4/2005 |
| JP | 2005-292772 A | 10/2005 |
| JP | 2006-56139 A | 3/2006 |
| JP | 2006-080447 A | 3/2006 |
| JP | 2006-205579 A | 8/2006 |
| JP | 2007-084625 A | 4/2007 |
| JP | 2008-019292 A | 1/2008 |
| JP | 2009-025683 A | 2/2009 |
| JP | 2012-58307 A | 3/2012 |
| KR | 10-1070656 B1 | 10/2011 |
| WO | 2006/114958 A1 | 11/2006 |
| WO | WO 2011/111741 * | 9/2011 ............ B29C 33/38 |
| WO | 2013/183468 A1 | 12/2013 |
| WO | 2014/046304 A1 | 3/2014 |

OTHER PUBLICATIONS

E. F. Hare et al., "Properties of Films of Adsorbed Fluorinated Acids," 58(3) J. Phys. Chem. 236-239 (Mar. 1954).
Office Action in Korean Application No. 10-2015-7009270 (dated Jan. 4, 2016).
First Office Action in Chinese Application No. 201380048860.6 (dated Sep. 25, 2015).
Extended European Search Report in European Application No. 13839386.3 (dated Jan. 22, 2016).
Notification of Second Office Action in Chinese Application No. 201380048860.6 (dated Jul. 27, 2016).
U.S. Appl. No. 14/402,806, filed Nov. 21, 2014, Mihara et al.
U.S. Appl. No. 14/419,382, filed Feb. 3, 2015, Ito et al.
Notification of Reasons for Refusal in Japanese Application No. 2013-028701 (dated Oct. 25, 2016).

* cited by examiner

FIG. 1A

MOLD CONTACT STEP
LIGHT IRRADIATION STEP

FIG. 1B

MOLD RELEASE STEP

FIG. 2A

MOLD CONTACT STEP
LIGHT IRRADIATION STEP

FIG. 2B

MOLD RELEASE STEP

PHOTOCURABLE COMPOSITION AND METHOD OF MANUFACTURING FILM USING THE COMPOSITION

TECHNICAL FIELD

The present invention relates to a photocurable composition and a method of manufacturing a film using the composition.

BACKGROUND ART

A UV nanoimprint method is one method of producing a resist film having a predetermined pattern shape on a substrate such as a substrate to be processed and has, for example, the following manufacturing process including steps (a) to (d):
(a) a placing step of placing a resist (photocurable composition);
(b) a mold contact step of bringing the photocurable composition and a mold having a fine concavo-convex pattern formed on its surface into contact with each other;
(c) a light irradiation step of irradiating the photocurable composition with light; and
(d) a mold release step of releasing the photocurable composition and the mold from each other after the light irradiation step.

It is to be noted that the pattern shape of the resist film produced through the manufacturing process including the steps (a) to (d) is formed by transferring the concavo-convex pattern of the mold onto the resist film placed on the substrate.

By the way, upon utilization of the UV nanoimprint method, to reduce a force needed for releasing the mold from the resist cured product in the mold release step (step (d)), i.e., a mold release force has been an important issue. This is because of the following reason. When the mold release force is large, problems such as the occurrence of a defect in the pattern and a reduction in positioning accuracy due to the floating of the substrate from a stage arise.

In addition, in the mold contact step (step (b)) to be performed before the mold release step, the photocurable composition is filled into a gap between the mold and the substrate, and the concavo-convex pattern formed on the surface of the mold. In the mold contact step, however, the following problems concerning the filling property of the photocurable composition have been occurring. It requires a long time period to fill the photocurable composition and a defect occurs owing to imperfect filling of the photocurable composition into a predetermined space.

Meanwhile, the photocurable composition to be used in the UV nanoimprint method is, for example, a composition disclosed in Patent Literature 1 formed of at least one kind of polymerizable compound, a polymerization initiator, and a fluorine-based surfactant. In addition, Patent Literature 1 discloses that a compound in which a hydrocarbon chain is bonded to a perfluoroalkyl chain, or a compound having a structure in which an ethoxy chain, a methoxy chain, or a siloxane is bonded to a perfluoroalkyl chain is used as the fluorine-based surfactant.

On the other hand, Patent Literature 2 discloses that a compound having a perfluoropolyether structure is used as the fluorine-based surfactant.

CITATION LIST

Patent Literature

PTL 1: Japanese Patent Application Laid-Open No. 2007-084625
PTL 2: Japanese Patent Application Laid-Open No. 2006-80447
PTL 3: International Patent WO2006/114958A

Non Patent Literature

NPL 1: Microelectronic Engineering, Vol. 82, P. 60-70, 2005
NPL 2: Journal of Physical Chemistry, Vol. 58, 236, 1954

SUMMARY OF INVENTION

Technical Problem

As described above, a technology involving adding the fluorine-based surfactant to the photocurable composition in the UV nanoimprint method to reduce the mold release force from the mold has been known since olden times. However, the mold release force from the mold has still been large after only the addition of the fluorine-based surfactant.

In addition, as disclosed in Non Patent Literature 1, the filling property of the photocurable composition tends to be higher as its surface tension increases or its contact angles with the mold and the substrate reduce. However, the addition of the fluorine-based surfactant to the photocurable composition has tended to reduce the surface tension or to enlarge the contact angle with the mold.

The present invention has been accomplished to solve the problems, and the present invention is directed to providing a photocurable composition having high filling property and capable of reducing a mold release force upon production of a film through the utilization of a photo-imprint method, and a method of manufacturing a film using the photocurable composition.

Solution to Problem

The photocurable composition of the present invention is a photocurable composition, including at least the following component (A) to component (C):
(A) a polymerizable compound;
(B) a photopolymerization initiator; and
(C) a surfactant represented by the following general formula (1):

$$Rf_1\text{-}Rc\text{-}X \qquad (1)$$

in the general formula (1), $Rf_1$ represents a substituent constituted only of a fluorine atom and a carbon atom, and having two or more trifluoromethyl groups, Rc represents a polyethylene oxide, a polypropylene oxide, or an alkylene group, and X represents a hydroxyl group, a carboxyl group, a sulfo group, an amino group, an alkoxy group, or a substituent constituted only of a fluorine atom and a carbon atom, and having two or more trifluoromethyl groups, provided that when X represents an alkoxy group or a substituent constituted only of a fluorine atom and a carbon atom, and having two or more trifluoromethyl groups, $Rf_1$ and X may be identical to or different from each other.

According to the present invention, there can be provided a photocurable composition having high filling property and capable of reducing a mold release force upon production of a film through the utilization of a photo-imprint method, and a method of manufacturing a film using the photocurable composition.

Further features of the present invention will become apparent from the following description of exemplary embodiments with reference to the attached drawings.

BRIEF DESCRIPTION OF DRAWINGS

FIGS. 3A, 3B1, 3B2, 3C, 3D, 3E and 3F are schematic sectional views illustrating an example of an embodiment in a method of manufacturing a film of the present invention.

DESCRIPTION OF EMBODIMENTS

Hereinafter, an embodiment of the present invention is described in detail with appropriate reference to drawings, provided that the present invention is not limited to the embodiment to be described below. In addition, in the present invention, embodiments obtained by, for example, appropriately changing and modifying the embodiment to be described below based on the ordinary knowledge of a person skilled in the art to such an extent that the change and modification do not deviate from the gist thereof are also included in the category of the present invention.

In addition, a method of manufacturing a film according to the present invention to be described later is, for example, a method of producing a film involving utilizing a photo-imprint method. Here, upon utilization of the photo-imprint method, a method of forming a film having a pattern having a size of 1 nm to 10 mm is preferred and a method of forming a film having a pattern having a size of about 10 nm to 100 µm is more preferred. A pattern formation technology for producing a film having a pattern (concavo-convex structure) of a nanosize (1 nm to 100 nm) by means of light is generally called a UV nanoimprint method. The present invention utilizes the UV nanoimprint method.

(Photocurable Composition)

The photocurable composition of the present invention contains at least the following component (A) to component (C):
(A) a polymerizable compound;
(B) a photopolymerization initiator; and
(C) a surfactant represented by the following general formula (1):

$$Rf_1\text{-}Rc\text{-}X \quad (1)$$

Hereinafter, each component is described in detail.

<Polymerizable Compound (Component (A))>

In the present invention, the polymerizable compound (component (A)) is a compound that reacts with a polymerizing factor (such as a radical or a cation) generated from the photopolymerization initiator (component (B)). In addition, after the reaction with the polymerizing factor, the polymerizable compound (component (A)) forms a film formed of a polymer compound through a chain reaction (polymerization reaction).

Examples of the polymerizable compound constituting the photocurable composition of the present invention include a radical polymerizable compound and a cation polymerizable compound.

A compound having one or more acryloyl groups or methacryloyl groups is preferred as the radical polymerizable compound. A compound having one or more vinyl ether groups, epoxy groups, or oxetanyl groups is preferred as the cation polymerizable compound.

(Polymerizable Compound (A)-Radical Polymerizable Component)

As monofunctional (meth)acrylic compounds having one acryloyl group or methacryloyl group, there are exemplified, for example, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl(meth)acrylate, 2,4,6-tribromophenoxyethyl(meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxy diethylene glycol (meth)acrylate, polyethylene glycol mono(meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth) acrylamide, isobutoxymethyl (meth) acrylamide, N,N-dimethyl (meth) acrylamide, t-octyl (meth) acrylamide, dimethylaminoethyl (meth)acrylate, diethylaminoethyl (meth)acrylate, 7-amino-3,7-dimethyloctyl (meth)acrylate, N,N-diethyl (meth)acrylamide, N,N-dimethylaminopropyl (meth)acrylamide, and the like, but are not limited thereto.

As commercial products of the monofunctional (meth) acrylic compounds, there are exemplified, Aronix M101, M102, M110, M111, M113, M117, M5700, TO-1317, M120, M150, and M156 (all of the above are manufactured by TOAGOSEI CO., LTD); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of the above are manufactured by OSAKA ORGANIC CHEMICAL INDUSTRY LTD.); Light Acrylate BO-A, EC-A, DMP-A, THF-A, HOP-A, HOA-MPE, HOA-MPL, PO-A, P-200A, NP-4EA, and NP-8EA, and Epoxy Ester M-600A (all of the above are manufactured by KYOEISHA CHEMICAL Co., LTD); KAYARAD TC110S, R-564, and R-128H (all of the above are manufactured by NIPPON KAYAKU Co., Ltd.); NK Ester AMP-10G and AMP-20G (both of the above are manufactured by Shin-Nakamura Chemical Co., Ltd.); FA-511A, 512A, and 513A (all of the above are manufactured by Hitachi Chemical Co., Ltd.); PHE, CEA, PHE-2, PHE-4, BR-31, BR-31M, and BR-32 (all of the above are manufactured by Dai-ichi Kogyo Seiyaku Co., Ltd.); VP (manufactured by BASF); ACMO, DMAA, and DMAPAA (all of the above are manufactured by KOHJIN Co., Ltd.), and the like, but are not limited thereto.

Examples of polyfunctional (meth)acrylic compounds each having two or more acryloyl groups or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercial products of the polyfunctional (meth)acrylic compounds include, but not limited to: Upimer UV SA1002 and SA2007 (both of the above are manufactured by Mitsubishi Chemical Corporation); Viscoat #195, #230, #215, #260, #335HP, #295, #300, #360, #700, GPT, and 3PA (all of the above are manufactured by OSAKA ORGANIC CHEMICAL INDUSTRY LTD.); Light Acrylate 4EG-A, 9EG-A, NP-A, DCP-A, BP-4EA, BP-4PA, TMP-A, PE-3A, PE-4A, and DPE-6A (all of the above are manufactured by KYOEISHA CHEMICAL Co., LTD); KAYARAD PET-30, TMPTA, R-604, DPHA, DPCA-20, -30, -60, and -120, and HX-620, D-310, and D-330 (all of the above are manufactured by NIPPON KAYAKU Co., Ltd.); Aronix M208, M210, M215, M220, M240, M305, M309, M310, M315, M325, and M400 (all of the above are manufactured by TOAGOSEI CO., LTD); and Lipoxy VR-77, VR-60, and VR-90 (all of the above are manufactured by SHOWA HIGHPOLYMER CO., LTD.).

One kind of the radical polymerizable compounds listed above may be used alone, or two or more kinds thereof may be used in combination. Note that, in the above-mentioned compound groups, the term "(meth)acrylate" means an acrylate and a methacrylate corresponding thereto. The term "(meth)acryloyl group" means an acryloyl group and a methacryloyl group corresponding thereto. The abbreviation "EO" refers to ethylene oxide, and the term "EO-modified compound" means a compound having a block structure of an ethylene oxide group. Further, the abbreviation "PO" refers to propylene oxide, and the term "PO-modified compound" means a compound having a block structure of a propylene oxide group.

(Polymerizable Compound (A)-Cation Polymerizable Component)

Examples of compounds each having one vinyl ether group include, but not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxy polyethylene glycol vinyl ether.

Examples of compounds each having two or more vinyl ether groups include, but not limited to: divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, a bisphenol A alkylene oxide divinyl ether, and a bisphenol F alkylene oxide divinyl ether; and polyfunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipentaerythritol hexavinyl ether.

Examples of compounds each having one epoxy group include, but not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of compounds each having two or more epoxy groups include, but not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexanemetha-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, a di(3,4-epoxycyclohexylmethyl)ether of ethylene glycol, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, and 1,2,5,6-diepoxycyclooctane.

Examples of compounds each having one oxetanyl group include, but not limited to, 3-ethyl-3-hydroxymethyloxetane, 3-(meth)allyloxymethyl-3-ethyloxetane, (3-ethyl-3-oxetanylmethoxy)methylbenzene, 4-fluoro[1-(3-ethyl-3-oxetanylmethoxy)methyl]benzene, 4-methoxy[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl)ether, isobornyloxyethyl (3-ethyl-3-oxetanylmethyl)ether, isobornyl (3-ethyl-3-oxetanylmethyl)ether, 2-ethylhexyl (3-ethyl-3-oxetanylmethyl)ether, ethyldiethylene glycol (3-ethyl-3-oxetanylmethyl)ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl)ether, tetrahydrofurfuryl (3-ethyl-3-oxetanylmethyl)ether, tetrabromophenyl (3-ethyl-3-oxetanylmethyl)ether, 2-tetrabromophenoxyethyl (3-ethyl-3-oxetanylmethyl)ether, tribromophenyl (3-ethyl-3-oxetanylmethyl)ether, 2-tribromophenoxyethyl (3-ethyl-3-oxetanylmethyl)ether, 2-hydroxyethyl (3-ethyl-3-oxetanylmethyl)ether, 2-hydroxypropyl (3-ethyl-3-oxetanylmethyl)ether, butoxyethyl (3-ethyl-3-oxetanylmethyl)ether, pentachlorophenyl (3-ethyl-3-oxetanylmethyl)ether, pentabromophenyl (3-ethyl-3-oxetanylmethyl)ether, and bornyl (3-ethyl-3-oxetanylmethyl)ether.

Examples of compounds each having two or more oxetanyl groups include, but not limited to, polyfunctional oxetanes such as 3,7-bis(3-oxetanyl)-5-oxa-nonane, 3,3'-(1,3-(2-methylenyl)propanediyl bis(oxymethylene)) bis(3-ethyloxetane), 1,4-bis[(3-ethyl-3-oxetanylmethoxy)methyl] benzene, 1,2-bis[(3-ethyl-3-oxetanylmethoxy)methyl] ethane, 1,3-bis[(3-ethyl-3-oxetanylmethoxy)methyl] propane, ethylene glycol bis(3-ethyl-3-oxetanylmethyl) ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyl dimethylene (3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl) ether, dipentaerythritol tetrakis(3-ethyl-3-oxetanylmethyl)ether, caprolactone-modified dipentaerythritol hexakis(3-ethyl-3-oxetanylmethyl) ether, caprolactone-modified dipentaerythritol pentakis(3-ethyl-3-oxetanylmethyl)ether, ditrimethylolpropane tetrakis(3-ethyl-3-oxetanylmethyl) ether, EO-modified bisphenol A bis(3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, and EO-modified bisphenol F (3-ethyl-3-oxetanylmethyl)ether.

One kind of the cation polymerizable compounds listed above may be used alone, or two or more kinds thereof may be used in combination. It is to be noted that in the above-mentioned compound groups, the abbreviation "EO" represents ethylene oxide and the term "EO-modified compound" means a compound having a block structure of an ethylene oxide group. In addition, the abbreviation "PO" represents propylene oxide and the term "PO-modified compound" means a compound having a block structure of a propylene oxide group. In addition, the term "hydrogenation" means addition of a hydrogen atom to a C=C double bond of a benzene ring or the like.

<Photopolymerization Initiator (Component (B))>

In the present invention, the photopolymerization initiator (component (B)) is a compound for generating the polymerizing factor (such as a radical or a cation) by sensing light having a predetermined wavelength. Specifically, when the polymerizable compound as the component (A) is a radical polymerizable compound, the photopolymerization initiator (component (B)) is a polymerization initiator that generates a radical with light (radiation, e.g., infrared light, visible light, ultraviolet light, far ultraviolet light, an X-ray, or a charged particle ray such as an electron ray). On the other hand, when the polymerizable compound as the component (A) is a cation polymerizable compound, the photopolymerization initiator is a polymerization initiator that generates an acid with light.

Examples of a compound as a radical generator include, but not limited to: 2,4,5-triarylimidazole dimers which may have a substituent such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1,2-methyl-1-[4-(methylthio)phenyl]-2-morpholino-propanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropyl thioxanthone, and 2-chloro thioxanthone; and xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis(2,6-dimethoxybenzoyl)-2,4,4-trimethylpentylphosphine oxide. It is to be noted that one kind of the compounds listed above may be used alone, or two or more kinds thereof may be used in combination.

Examples of commercial products of the photoradical generator include, but not limited to, Irgacure 184, 369, 651, 500, 819, 907, 784, and 2959, CGI-1700, -1750, and -1850, CG24-61, and Darocur 1116 and 1173 (all of the above are manufactured by Ciba Japan), Lucirin TPO, LR8893, and LR8970 (all of the above are manufactured by BASF), and Ubecryl P36 (manufactured by UCB).

For example, an onium salt compound, a sulfone compound, a sulfonic acid ester compound, a sulfonimide compound, and a diazomethane compound are given as a compound to be used as the polymerization initiator that generates an acid with light. The compound is not limited to those compounds. In the present invention, of those compounds, an onium salt compound is preferably used.

Examples of the onium salt compound include an iodonium salt, a sulfonium salt, a phosphonium salt, a diazonium salt, an ammonium salt, and a pyridinium salt. Specific examples of the onium salt compound include, but not limited to, bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl)sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris(4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)sulfonium benzenesulfonate, tris(4-methoxyphenyl)sulfonium 10-camphorsulfonate, and tris(4-methoxyphenyl)sulfonium n-octanesulfonate.

Examples of the sulfone compound can include β-ketosulfone, β-sulfonylsulfone, and α-diazo compounds thereof. Specific examples of the sulfone compound include, but not limited to, phenacyl phenyl sulfone, mesithyl phenacyl sulfone, bis(phenylsulfonyl)methane, and 4-trisphenacyl sulfone.

Examples of the sulfonic acid ester compound can include an alkyl sulfonic acid ester, a haloalkyl sulfonic acid ester, an aryl sulfonic acid ester, and an iminosulfonate. Specific examples of the sulfonic acid ester compound include, but not limited to, α-methylolbenzoin perfluoro-n-butanesulfonate, α-methylolbenzoin trifluoromethanesulfonate, and α-methylolbenzoin 2-trifluoromethylbenzenesulfonate.

Specific examples of the sulfonimide compounds include, but not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptan-5,6-oxy-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy)bicyclo[2.2.1]heptan-5,6-oxy-2,3-dicarboximide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboximide, N-(4-methylphenylsulfonyloxy)-7-oxabicyclo[2.2.1]hept-5-ene-2,3-dicarboximide, N-(4-methylphenylsulfonyloxy)bicyclo[2.2.1]heptan-5,6-oxy-2,3-dicarboximide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxy)bicyclo[2.2.1]heptan-5,6-oxy-2,3-dicarboximide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxy)bicyclo[2.2.1]heptan-5,6-oxy-2,3-dicarboximide, and N-(4-fluorophenylsulfonyloxy)naphthylimide.

Specific examples of the diazomethane compound include, but not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, (cyclohexylsulfonyl) (1,1-dimethylethylsulfonyl)diazomethane, and bis(1,1-dimethylethylsulfonyl)diazomethane.

Of those photoacid generators, the onium salt compound is preferred. In the present invention, one kind of the photoacid generators may be used alone, or two or more kinds thereof may be used as a mixture.

A compounding ratio of the polymerization initiator as the component (B) is 0.01 wt % or more and 10 wt % or less, preferably 0.1 wt % or more and 7 wt % or less with respect to a total amount of the polymerizable compound as the component (A). If the compounding ratio of the polymerization initiator is less than 0.01 wt %, its curing rate is lowered, thereby leading to a lower reaction efficiency. On the other hand, if the compounding ratio of the polymerization initiator exceeds 10 wt %, the photocurable composition may be inferior in mechanical property of a cured product.

<Surfactant (Component (C))>

In the present invention, the surfactant (component (C)) is a compound represented by the following general formula (1).

In the general formula (1), $Rf_1$ represents a substituent constituted only of a fluorine atom and a carbon atom, and having two or more trifluoromethyl groups. The substituent represented by $Rf_1$ is, for example, a substituent shown below. However, the present invention is not limited thereto.

(★ represents a bonding hand with Rc.)

In the general formula (1), Rc represents a divalent substituent, specifically, a polyethylene oxide, a polypropylene oxide, or an alkylene group.

The polyethylene oxide represented by Rc is specifically a divalent substituent represented by the following formula.

$$-(OCH_2CH_2)_a-$$

(a represents an integer of 1 or more, preferably an integer of 1 or more and 25 or less.)

The polypropylene oxide represented by Rc is specifically one of divalent substituents represented by the following formula (i) and formula (ii).

$$-(OCH_2CH(CH_3))_b- \quad (i)$$

(In the formula (i), b represents an integer of 1 or more, preferably an integer of 1 or more and 25 or less.)

$$-(OCH_2CH_2CH_2)_b- \quad (ii)$$

(In the formula (ii), b represents an integer of 1 or more, preferably an integer of 1 or more and 25 or less.)

The alkylene group represented by Rc is specifically a divalent substituent represented by the following formula.

$$-(CH_2)_c-$$

(c represents an integer of 1 or more, preferably an integer of 1 or more and 25 or less.)

In the general formula (1), X represents a hydroxyl group, a carboxyl group, a sulfo group, an amino group, an alkoxy group, or a substituent constituted only of a fluorine atom and a carbon atom, and having two or more trifluoromethyl groups. Here, when X represents a substituent constituted only of a fluorine atom and a carbon atom, and having two or more trifluoromethyl groups, the substituent represented by X is, for example, a substituent shown below. However, the present invention is not limited thereto.

(★ represents a bonding hand with Rc.)

It is to be noted that when X represents an alkoxy group or a substituent constituted only of a fluorine atom and a carbon atom, and having two or more trifluoromethyl groups, $Rf_1$ and X may be identical to or different from each other.

In the present invention, the surfactant as the component (C) is preferably a compound represented by the following formula (2) or (3).

(In the general formulae (2) and (3), n represents an integer of 1 or more, preferably an integer of 1 or more and 25 or less.)

The inventors of the present invention have made extensive studies, and as a result, have found that the use of the photocurable composition of the present invention can reduce a mold release force to be produced upon release of a mold from the photocurable composition after light irradiation. The inventors of the present invention have considered the reason why the use of the photocurable composition of the present invention can reduce the mold release force to be produced at the time of the release of the mold to be as described below.

Figure 1A:
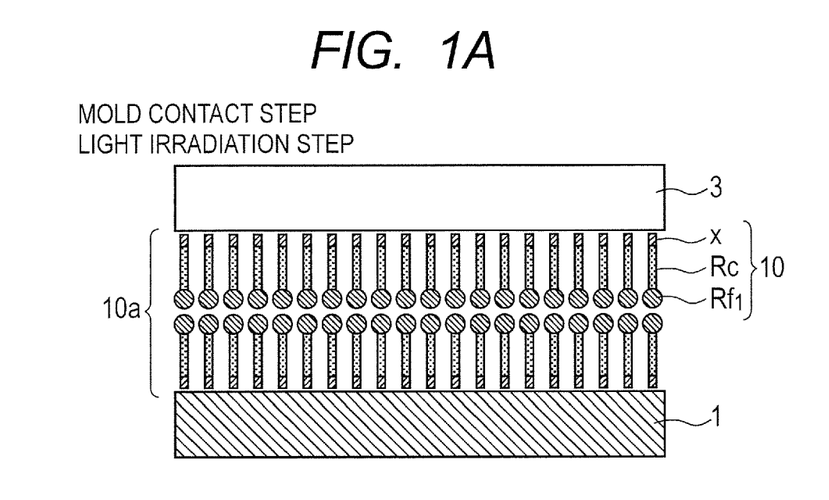
FIGS. 1A and 1B are schematic sectional views illustrating the placement mode of a surfactant in a process from a mold formation step to a mold release step.
Figure 1B:
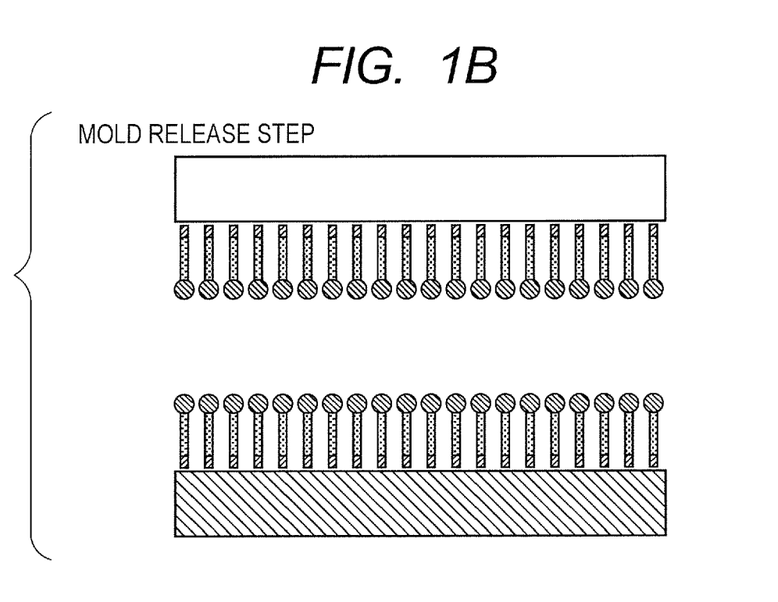

FIG. 1 are schematic sectional views illustrating the placement mode of the surfactant in a process from a mold formation step to a mold release step. It is to be noted that FIG. 1 are also figures illustrating the placement mode of the surfactant when the surfactant in which X in the formula (1) represents a hydroxyl group, a carboxyl group, a sulfo group, an amino group, or an alkoxy group is used.

As illustrated in FIG. 1A, a surfactant 10 as the component (C) segregates to an interface between a photocurable composition 1 and a mold 3 in a mold contact step and a light irradiation step. At this time, X as a polar substituent out of a skeleton constituting the surfactant 10 is placed so as to approach the photocurable composition 1 or the mold 3 as illustrated in FIG. 1A. Meanwhile, a substituent $Rf_1$ constituted only of a fluorine atom and a carbon atom, and having two or more trifluoromethyl groups is placed so as to be as remote as possible from the photocurable composition 1 or the mold 3 as illustrated in FIG. 1A. Accordingly, as illustrated in FIG. 1A, the surfactant 10 present between the photocurable composition 1 and the mold 3 may form a bimolecular lamellar structure 10a in a state where the skeletons $Rf_1$ are opposed to each other.

The dismount of the bimolecular lamellar structure 10a formed in the mold contact step and the light irradiation step starts from a site where the skeletons $Rf_1$ are opposed to each other in the mold release step as illustrated in FIG. 1B. By the way, a trifluoromethyl group is known to have a particularly low critical surface tension among fluoroalkyl compounds (Non Patent Literature 2). The surfactant (C) in the photocurable composition of the present invention is such that multiple trifluoromethyl groups are present at the skeleton $Rf_1$ (fluorine atom-containing site). It is assumed from the foregoing that a van der Waals force between the skeletons $Rf_1$ in adjacent molecules becomes additionally small and hence an interfacial bonding force in the bimolecular lamellar structure is reduced.

Figure 2A:
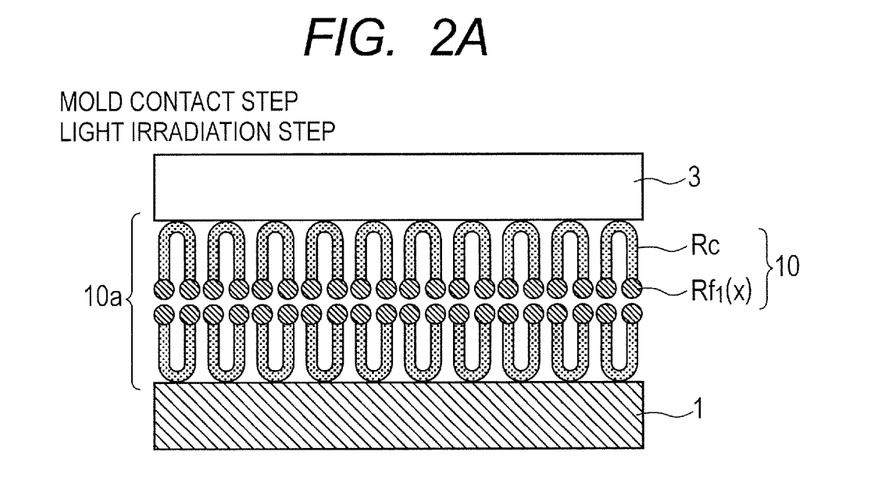
FIGS. 2A and 2B are schematic sectional views illustrating the placement mode of the surfactant in the process from the mold formation step to the mold release step.
Figure 2B:
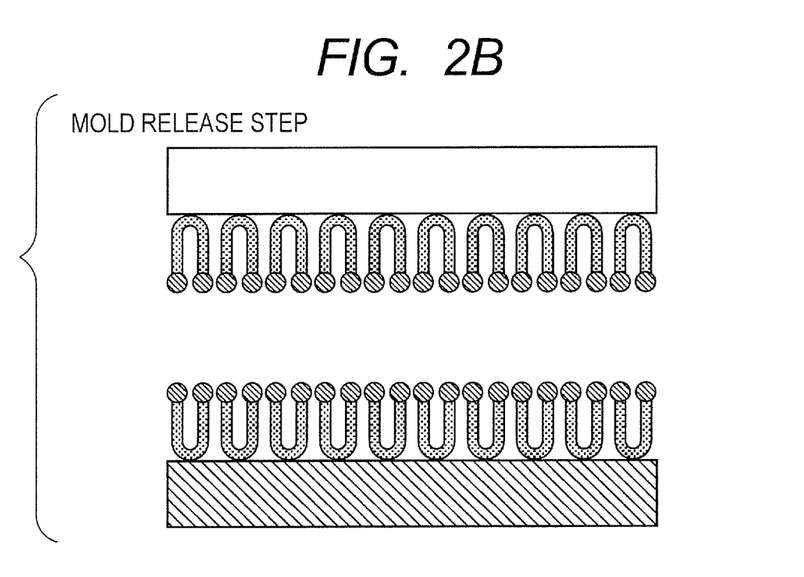

FIG. 2 are schematic sectional views illustrating the placement mode of the surfactant in the process from the mold formation step to the mold release step. It is to be noted that FIG. 2 are also figures illustrating the placement mode of the surfactant when the surfactant in which X in the formula (1) represents a substituent constituted only of a fluorine atom and a carbon atom, and having two or more trifluoromethyl groups is used. In the case of the surfactant in which X in the formula (1) represents a substituent constituted only of a fluorine atom and a carbon atom, and having two or more trifluoromethyl groups, X and $Rf_1$ are placed so as to be as remote as possible from the photocurable composition 1 or the mold 3 as illustrated in FIG. 2A. Accordingly, as illustrated in FIG. 2A, the bimolecular lamellar structure 10a in which the skeletons $Rf_1$ (or the substituents X) are opposed to each other may be formed. It is to be noted that the dismount of the bimolecular lamellar structure 10a illustrated in FIG. 2A starts from a site where the skeletons $Rf_1$ or the substituents X are opposed to each other in the mold release step as illustrated in FIG. 2B.

In addition, the inventors of the present invention have made extensive studies, and as a result, have found that the photocurable composition of the present invention shows high filling property. Although the reason for the foregoing is unclear, the photocurable composition of the present invention has a high surface tension and shows a low contact angle with respect to a quartz mold or substrate as compared with any other photocurable composition containing a fluorine-based surfactant as described in examples to be described later. It can be said from the foregoing that the high surface tension and the low contact angle with respect to the quartz mold or substrate are deeply involved in the filling property of the photocurable composition of the present invention.

Specific examples of a compound serving as the surfactant as the component (C) are shown below, provided that the present invention is not limited thereto.

In the photocurable composition of the present invention, one kind of the surfactants as the component (C) may be used alone, or two or more kinds thereof may be used as a mixture.

In addition, it is preferred to appropriately adjust the addition amount of mainly the component (C) in the photocurable composition of the present invention. Specifically, the addition amount of the component (C) is preferably adjusted so that the water contact angle of the surface of a photo-cured film obtained by curing the photocurable composition may be 74° or less.

As described in, for example, Patent Literature 3, it has heretofore been considered that the water repellency of a photo-cured film is preferably as large as possible. Specifically, it has been considered that a value for the water contact angle of (the surface of) the photo-cured film is preferably as high as 75° to 98°.

The reason why a low mold release force is realized by setting the water contact angle of the film (photo-cured film) obtained from the photocurable composition of the present invention to 74° or less is unclear. The inventors of the present invention have considered the reason for the foregoing to be, for example, as described below. The component (C) segregates to the surface of the resultant film and a large number of Rc sites in the component (C) are present on the film to express hydrophilicity on the film surface. In addition, such Rc site forms a bond with the surface of a mold, and hence a thin film of the component (C) is formed at an interface between the mold and the resist, which reduces the mold release force.

The compounding ratio of the surfactant as the component (C) in the photocurable composition of the present invention is, for example, 0.001 wt % to 10 wt % with respect to the total amount of the polymerizable compound as the component (A). The compounding ratio is preferably 0.002 wt % to 5 wt %, more preferably 0.005 wt % to 3 wt %. When the compounding ratio is less than 0.001 wt %, an effect of the present invention cannot be sufficiently exerted. When the compounding ratio exceeds 10 wt %, the filling property of the photocurable composition itself reduces because its surface tension reduces or its contact angle with respect to a mold or a substrate increases.

<Other Addition Components>

In addition, the photocurable composition of the present invention may further contain an addition component in addition to the component (A) to component (C). That is, an addition component such as a sensitizer, an antioxidant, a solvent, or a polymer component may be incorporated into the photocurable composition of the present invention in addition to the polymerizable compound (component (A)), the polymerization initiator (component (B)), and the surfactant (component (C)) depending on various purposes to such an extent that the effect of the present invention is not impaired.

The sensitizer is a compound properly added for the purpose of accelerating the polymerization reaction or improving a reaction conversion ratio. Examples of the sensitizer include a hydrogen donor and a sensitizing dye.

The hydrogen donor is a compound that reacts with an initiation radical generated from the polymerization initiator as the component (B) or a radical at a polymerization growth terminal to generate a radical having additionally high reactivity. The hydrogen donor is preferably added when an optical radical generator is used as the polymerization initiator.

Specific examples of the hydrogen donor include, but not limited to, N-butylamine, di-n-butylamine, tri-n-butylphosphine, allylthiourea, s-benzylisothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N- dimethylaminobenzoic acid isoamyl ester, pentyl-4-dimethylaminobenzoate, triethanolamine, amine compounds such as N-phenylglycine, 2-mercapto-N-phenylbenzimidazole, and mercapto compounds such as mercaptopropionic acid ester.

The sensitizing dye is a compound that is excited by absorbing light having a specific wavelength to show an interaction with the polymerization initiator as the component (B). It is to be noted that the term "interaction" as used herein refers to, for example, the transfer of energy or an electron from the sensitizing dye in an excited state to the polymerization initiator as the component (B).

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a thioxanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, a oxonol-based dye, a cyanine-based dye, a rhodamine-based dye, and a pyrylium salt-based dye.

One kind of the sensitizers may be used alone or two or more kinds thereof may be used as a mixture.

In the photocurable composition of the present invention, the content of the sensitizer is preferably 0 wt % to 20 wt %, more preferably 0.1 wt % to 5.0 wt %, still more preferably 0.2 wt % to 2.0 wt % with respect to the total amount of the polymerizable compound as the component (A). When the content of the sensitizer is set to at least 0.1 wt % or more, an effect of the sensitizer can be expressed in an additionally effective fashion. In addition, when the content of the sensitizer is set to 5.0 wt % or less, a polymer compound constituting a photo-cured product to be produced has a sufficiently high molecular weight, and its dissolution failure and the deterioration of its storage stability can be suppressed.

<Temperature at Time of Compounding of Photocurable Composition>

The preparation of the photocurable composition by the mixing and dissolution of a reagent and a solvent is performed under a predetermined temperature condition. Specifically, the preparation is performed at a temperature in the range of 0° C. to 100° C.

<Viscosity of Photocurable Composition>

The viscosity of the photocurable composition of the present invention is preferably 1 cP to 100 cP, more preferably 5 cP to 50 cP, still more preferably 6 cP to 20 cP at 23° C. in a mixture of the components except the solvent. In the case where the viscosity of the photocurable composition is higher than 100 cP, a long time period may be needed for filling the photocurable composition into a recessed portion out of fine patterns on a mold when the composition is brought into contact with the mold, or a pattern defect may occur owing to a failure in the filling. On the other hand, in the case where the viscosity is lower than 1 cP, application unevenness may occur upon application of the photocurable composition or the photocurable composition may flow out of an end portion of the mold when the photocurable composition is brought into contact with the mold.

<Surface Tension of Photocurable Composition>

The photocurable composition of the present invention has a surface tension at 23° C. of preferably from 5 mN/m to 70 mN/m, more preferably from 7 mN/m to 35 mN/m, still more preferably from 10 mN/m to 32 mN/m in a mixture of components except a solvent. Here, if the surface tension is less than 5 mN/m, when the photocurable composition is brought into contact with a mold, it requires a long time for the composition to fill a recessed portion out of fine patterns on the mold. On the other hand, when the surface tension is more than 70 mN/m, the surface smoothness becomes low.

<Impurities Such as Particle Included in Photocurable Composition>

Impurities are desirably removed from the photocurable composition of the present invention to the extent possible. For example, in order that the defect of a pattern may be prevented from occurring owing to unprepared appearance of concavo-convex pattern in a photo-cured product due to a particle included in the photocurable composition, impurities such as the particle are desirably removed. Specifically, it is preferred that the respective components in the photocurable composition be mixed and then the mixture be filtered with a filter having a pore diameter of, for example, 0.001 µm to 5.0 µm. It is more preferred that the filtration with the filter be performed in multiple stages or be repeated multiple times. In addition, the filtered liquid may be filtered again. A filter made of, for example, a polyethylene resin, polypropylene resin, fluororesin, or nylon resin can be used as the filter to be used in the filtration. However, the filter is not particularly limited thereto.

It is to be noted that, upon use of the photocurable composition of the present invention for the manufacture of a semiconductor integrated circuit, the amount of a metal impurity to be included in the composition is preferably reduced to the extent possible in order that the operation of a product may not be inhibited. Accordingly, in the photocurable composition of the present invention, the concentration of the metal impurity that can be incorporated into the composition is set to preferably 10 ppm or less, more preferably 100 ppb or less.

(Method of Forming Film)

Figure 3A:
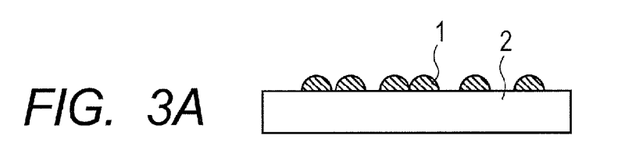
Figure 3B:
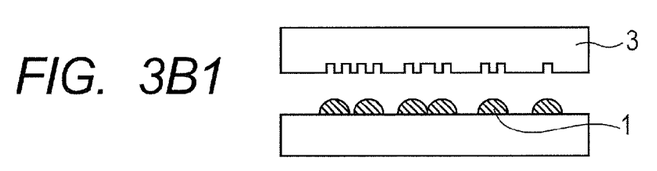
Figure 3B:
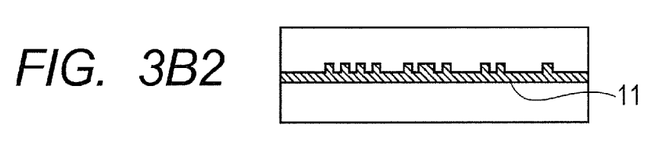
Figure 3C:
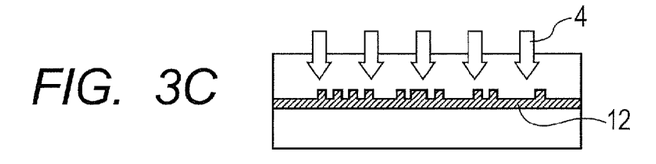
Figure 3D:
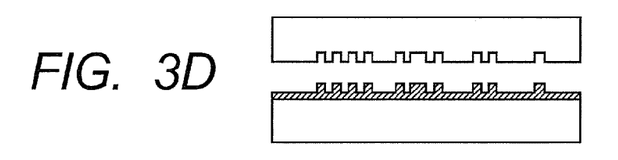
Figure 3E:
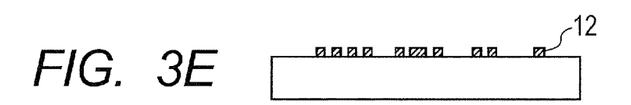
Figure 3F:
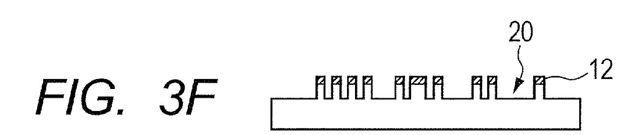

Next, a method of forming a film of the present invention is described. FIG. 3 are schematic sectional views illustrating an example of an embodiment in the method of manufacturing a film of the present invention. A manufacturing process illustrated in FIG. 3 is a manufacturing process formed of steps described in the following sections (1) to (5) or (6):

(1) a placing step (applying step, FIG. 3A);
(2) a mold contact step (FIGS. 3B1 and 3B2);
(3) a light irradiation step (FIG. 3C);
(4) a mold release step (FIG. 3D);
(5) a residual film removal step (FIG. 3E); and
(6) a substrate processing step (FIG. 3F).

In the manufacturing process, the residual film removal step (FIG. 3E) is the step of removing a film (residual film) remaining in a recessed portion of the photocurable composition through etching after the mold release step (FIG. 3D) to expose the surface of a substrate 2 as a substrate to be processed in the recessed portion of a pattern. The residual film removal step (FIG. 3E) is desirably performed upon production of an optical element or an electronic component through the utilization of the manufacturing process.

In the present invention, the surface of a mold in contact with the photocurable composition in the contact step is preferably quartz. Quartz has a good affinity for a polar substituent such as ethylene oxide, propylene oxide, or a hydroxyl group, and hence the bimolecular lamellar structure illustrated in FIG. 1 or FIG. 2 is easily formed.

In addition, in the present invention, the light irradiation step is preferably the step of irradiating the photocurable composition with light through the mold and the mold to be used has concavo-convex pattern on its surface. The use of the mold can form a film having a pattern shape corresponding to the concavo-convex patter provided on the surface of the mold.

Through the steps described in the sections (1) to (6) (or the steps described in the sections (1) to (5)), a photo-cured product 12 and an electronic component (electronic device) or optical component having the photo-cured product 12 can be obtained from the photocurable composition 1. Hereinafter, details about the respective steps are described.

<Placing Step (FIG. 3A)>

First, the photocurable composition 1 is placed (applied) on the substrate 2 to form an applied film (FIG. 3A). The term "photocurable composition" as used herein refers to the photocurable composition of the present invention.

A silicon wafer is generally used for the substrate to be processed corresponding to the substrate 2, but a material for the substrate is not limited to this. In addition to the silicon wafer, there may be used a material arbitrarily selected from any known materials for a substrate of a semiconductor device such as aluminum, a titanium-tungsten alloy, an aluminum-silicon alloy, an aluminum-copper-silicon alloy, silicon oxide, and silicon nitride. It is to be noted that, as the substrate to be used (substrate to be processed), there may be used a substrate whose adhesion property to a photocurable composition is improved by virtue of a surface treatment such as a silane coupling treatment, a silazane treatment, or a film formation of an organic thin film.

As a method of placing the photocurable composition of the present invention on the substrate to be processed, there may be used, for example, an ink jet method, a dip coating method, an air knife coating method, a curtain coating method, a wire bar coating method, a gravure coating method, an extrusion coating method, a spin coating method, or a slit scan method. It is to be noted that the thickness of the layer to be subjected to shape transfer (applied film) varies depending on the application, and is, for example, 0.01 µm to 100.0 µm.

<Mold Contact Step (FIGS. 3B1 and 3B2)>

Next, the step of bringing the mold into contact with the applied film formed of the photocurable composition 1 formed in the preceding step (placing step) (mold contact step, FIG. 3B1, FIG. 3B2) is performed. It is to be noted that the step is also referred to as a mold contact step because the mold 3 is considered as a stamp. When the mold 3 is brought into contact with the photocurable composition 1 (layer to be subjected to shape transfer) in the step (FIG. 3B1), a recessed portion of the fine pattern formed on the mold 3 is filled with (part of) the applied film 11 (FIG. 3B2).

The mold 3 to be used in the mold contact step needs to be constituted of an optically transparent material in consideration of the next step (light irradiation step). Glass, quartz, an optically transparent resin such as a PMMA or a polycarbonate resin, a transparent metal-deposited film, a flexible film made of a polydimethylsiloxane or the like, a photo-cured film, and a metal film can be given as specific examples of the constituent material for the mold 3. It is to be noted that when an optically transparent resin is used as the constituent material for the mold 3, a resin that does not dissolve in the solvent in the photocurable composition 1 needs to be selected. In addition, the surface of the mold in contact with the photocurable composition is preferably hydrophilic because a polar bond with Rc or X as a substituent in the surfactant as the component (C) is easily formed, and the surface is particularly preferably quartz.

The mold 3 to be used in the method of manufacturing a photo-cured product of the present invention may be subjected to a surface treatment for improving releasability between the photocurable composition 1 and the surface of the mold 3 before use. A method for the surface treatment is, for example, a method involving applying a mold release agent to the surface of the mold to form a mold release agent layer before the performance of the mold contact step. Here, examples of the mold release agent to be applied to the surface of the mold include a silicone-based mold release agent, a fluorine-based mold release agent, a polyethylene-based mold release agent, a polypropylene-based mold release agent, a paraffin-based mold release agent, a montan-based mold release agent, and a carnauba-based mold release agent. For example, a commercially available application type mold release agent such as an OPTOOL DSX manufactured by Daikin Industries, Ltd. can be suitably used. It is to be noted that one kind of those mold release agents may be used alone, or two or more kinds thereof may be used in combination. Of those, a fluorine-based mold release agent is particularly preferred.

The pressure to be applied to the photocurable composition 1 when the mold 3 is brought into contact with the photocurable composition 1 as illustrated in FIG. 3B1 in the mold contact step is typically 0.1 MPa to 100 MPa, though the pressure is not particularly limited. Of such range, a pressure of 0.1 MPa to 50 MPa is preferred, a pressure of 0.1 MPa to 30 MPa is more preferred, and a pressure of 0.1 MPa to 20 MPa is still more preferred. In addition, the time period for which the mold 3 is brought into contact with the layer 1 to be subjected to shape transfer in the contact step is typically 1 second to 600 seconds, preferably 1 second to 300 seconds, more preferably 1 second to 180 seconds, particularly preferably 1 second to 120 seconds, though the time period is not particularly limited.

In addition, the mold contact step can be performed under any one of the following conditions: under an air atmosphere, under a reduced-pressure atmosphere, and under an inert gas atmosphere. A reduced-pressure atmosphere or an inert gas atmosphere is preferred because an influence of oxygen or moisture on the photo-curing reaction can be prevented. When the mold contact step is performed under an inert gas atmosphere, specific examples of the inert gas to be used include nitrogen, carbon dioxide, helium, argon, various chlorofluorocarbon gases, and a mixed gas thereof. When this step (contact step) is performed under a specific gas atmosphere including an air atmosphere, a preferred pressure is 0.0001 atmosphere to 10 atmospheres. It is to be noted that a reduced-pressure atmosphere or an inert gas atmosphere is preferred because an influence of oxygen or moisture on the photo-curing reaction can be prevented.

<Light Irradiation Step (FIG. 3C)>

Next, the applied film 11 is irradiated with light through the mold 3 (FIG. 3C). In the step, the applied film 11 is cured with the applied light to form the photo-cured product 12.

Here, the light with which the photocurable composition 1 constituting the applied film 11 is irradiated is selected in accordance with the sensitivity wavelength of the photocurable composition 1. Specifically, it is preferred that ultraviolet light having a wavelength of about 150 nm to 400 nm, an X-ray, an electron beam, or the like be appropriately selected and used. Here, many of the compounds commercially available as curing aids (photopolymerization initiators) have sensitivity to the ultraviolet light. Accordingly, the light with which photocurable composition 1 is irradiated (irradiation light 4) is particularly preferably the ultraviolet light. Here, examples of the light source of ultraviolet light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. The number of the light source to be used may be one or more. Further, when the photocurable composition 1 is irradiated with light, the entire surface thereof may be irradiated with light, or a part of the surface thereof may be irradiated with light.

In addition, when the layer to be subjected to shape transfer cures also with heat, heat curing may be further performed. When the heat curing is performed, a heating atmosphere, a heating temperature, and the like are not particularly limited. For example, under an inert atmosphere or under reduced pressure, the photocurable composition 1 can be heated at a temperature in the range of 40° C. to 200° C. In addition, a hot plate, an oven, a furnace, or the like can be used upon heating of the layer 1 to be subjected to shape transfer.

<Mold Release Step (FIG. 3D)>

Next, the step of releasing the mold 3 from the photo-cured product 12 to form a cured film having a predetermined pattern shape on the substrate 2 (mold release step, FIG. 3D) is performed. The step (mold release step) is the step of releasing the mold 3 from the photo-cured product 12, and the reverse pattern of the fine pattern formed on the mold 3 in the preceding step (light irradiation step) is obtained as the pattern of the photo-cured product 12.

A method of releasing the mold 3 from the photo-cured product 12 is not particularly limited as long as part of the photo-cured product 12 does not physically fracture during the release, and various conditions for the release and the like are also not particularly limited. For example, the mold 3 may be released as described below. The substrate to be processed (substrate 2) is fixed and the mold 3 is moved so that the mold may go away from the substrate to be processed. Alternatively, the mold 3 may be released as described below. The mold is fixed and the substrate to be processed is moved so that the substrate may go away from the mold. Alternatively, the mold may be released by pulling both the substrate and the mold in directions diametrically opposed to each other.

<Residual Film Removed Step (FIG. 3E)>

Although the cured film to be obtained when the mold release step is performed has a specific pattern shape, part of the film may exist as a residual film even in a region except the region where the pattern shape is formed. In view of the foregoing, the step of removing the photo-cured film (residual film) remaining in a region from which the photo-cured product should be removed out of the pattern shape (residual film removed step, FIG. 3E) is performed.

Here, a method of removing the residual film is, for example, a method involving removing the film (residual film) remaining in a recessed portion of the photo-cured product 12 by etching to expose the surface of the substrate 2 in the recessed portion of the pattern.

When the etching is utilized, a specific method therefor is not particularly limited and a desired pattern shape can be formed by a conventionally known method, for example, by performing dry etching. A conventionally known dry etching apparatus can be used in the dry etching. In addition, a source gas at the time of the dry etching is appropriately selected depending on the elemental composition of a film to be etched. For example, a gas containing an oxygen atom such as $O_2$, CO, or $CO_2$, an inert gas such as He, $N_2$, or Ar, a chlorine-based gas such as $Cl_2$ or $BCl_3$, or a gas of $H_2$ or $NH_3$ can be used. It is to be noted that those gases can be used as a mixture.

The photo-cured product 12 having a desired concavo-convex pattern shape (pattern shape attributable to the concavo-convex shape of the mold 3) can be obtained by the manufacturing process including the steps (1) to (5). Here, when the substrate 2 is processed by utilizing the photo-cured product 12, the step of processing the substrate to be described later is further performed in some cases.

Meanwhile, the resultant photo-cured product 12 can be utilized as an optical member (the case where the product is used as one member of the optical member is included). In such case, the photo-cured product 12 can be provided as an optical member having at least the substrate 2 and the photo-cured product 12 placed on the substrate 2.

<Substrate Processing Step (FIG. 3F)>

The photo-cured product 12 having a desired concavo-convex pattern shape obtained by the manufacturing method of the present invention can be utilized as, for example, a film for an interlayer insulating film in an electronic component typified by a semiconductor element such as an LSI, a system LSI, a DRAM, an SDRAM, an RDRAM, or a D-RDRAM. Meanwhile, the photo-cured product 12 can also be utilized as a resist film at the time of the manufacture of a semiconductor element.

When the photo-cured product 12 is utilized as a resist film, specifically, part of the substrate whose surface has been exposed by the etching step (region represented by reference numeral 20) is subjected to, for example, etching or ion implantation as illustrated in FIG. 3F. It is to be noted that at this time, the photo-cured product 12 functions as a mask. Thus, a circuit structure (not shown) based on the pattern shape of the photo-cured product 12 can be formed on the substrate 2. Thus, a substrate with a circuit to be utilized in a semiconductor element or the like can be manufactured. It is to be noted that an electronic component is formed by providing an electronic member for the substrate with a circuit.

It is to be noted that when the substrate with a circuit or the electronic component is produced, the pattern of the photo-cured product may be finally removed from the processed substrate, but such a constitution that the pattern is left as a member for constituting an element is also preferred.

EXAMPLES

Hereinafter, the present invention is described in more detail by way of examples, but the technical scope of the present invention is not limited to the examples to be described below.

Example 1

(1) Photocurable Composition

First, the following component (A), component (B), and component (C) were compounded to provide a mixed solution.

(1-1) Component (A): 100 Parts by Weight in Total
<A-1> Isobornyl acrylate (manufactured by KYOEISHA CHEMICAL Co., LTD., trade name: IB-XA): 61.6 parts by weight
<A-2> (2-Methyl-2-ethyl-1,3-dioxolan-4-yl)methyl acrylate (manufactured by OSAKA ORGANIC CHEMICAL INDUSTRY LTD., trade name: MEDOL-10):10 parts by weight
<A-3> Hexanediol diacrylate (manufactured by OSAKA ORGANIC CHEMICAL INDUSTRY LTD., trade name: Viscoat #230): 22.4 parts by weight
(1-2) Component (B): 5 Parts by Weight in Total
<B-1> Irgacure 907 (manufactured by Ciba Japan): 1 part by weight
<B-2> Darocur TPO (manufactured by Ciba Japan): 2 parts by weight
<B-3> Darocur 1173 (manufactured by Ciba Japan): 2 parts by weight
(1-3) Component (C): 2 Parts by Weight
A surfactant FTERGENT 251 (manufactured by Neos) represented by the following formula (C-1): 2 parts by weight (C-1)

Next, the resultant mixed solution was filtered with a filter made of an ultra-high molecular weight polyethylene whose mesh was 5 nm. Thus, a photocurable composition (a-1) of this example (Example 1) was prepared.
(1-4) Measurement of Surface Tension of Resist (Photocurable Composition)
The surface tension of the photocurable composition (a-1) measured with an automatic surface tension meter CBVP-A3 (manufactured by Kyowa Interface Science Co., Ltd.) was 30.4 mN/m. The value was higher than that of a photocurable composition (b-2) prepared in Comparative Example 2 to be described later.
(1-5) Measurement of Contact Angle of Resist (Photocurable Composition)
A droplet obtained by dropping 1 µL of the photocurable composition (a-1) on a quartz substrate was measured for its contact angle with a fully automatic contact angle meter CA-W (manufactured by Kyowa Interface Science Co., Ltd.). As a result, the contact angle was 10.8°. The value was lower than that of the photocurable composition (b-2) prepared in Comparative Example 2 to be described later.
Next, a photo-cured product was produced by the following method.

(2) Placing Step

A total of 1,440 droplets (11 pL per one droplet) of the photocurable composition (a-1) were dropped on a 300-mm silicon wafer having formed thereon an adhesion-promoting layer having a thickness of 3 nm as an adhesion layer by an ink jet method. It is to be noted that at the time of the dropping of the respective droplets, the respective droplets were dropped in a region having a longitudinal length of 26 mm and a horizontal length of 33 mm so as to be arranged at substantially equal intervals.

(3) Mold Contact Step and Light Irradiation Step

Next, a quartz mold (having a longitudinal length of 26 mm and a horizontal length of 33 mm) which had not been subjected to any surface treatment and on which no pattern had been formed was brought into contact with the silicon wafer from above.
Next, 30 seconds after the quartz mold had been brought into contact, the photocurable composition was irradiated with UV light by using an ultra-high pressure mercury lamp through the quartz mold. It is to be noted that an interference filter through which light having a wavelength of 313±5 nm could be selectively caused to permeate was placed between a UV light source and the quartz mold at the time of the irradiation with UV light. In addition, the illumination intensity of UV light directly below the quartz mold was 38.5 mW/cm$^2$ at a wavelength of 313 nm. The irradiation with UV light was performed for 5 seconds under the foregoing conditions.

(4) Mold Release Step

Next, the quartz mold was lifted under a condition of 0.5 mm/s. Thus, the mold was released from the photo-cured product.
The photo-cured product was obtained through the foregoing steps.

(5) Evaluation of Photo-Cured Product

Next, the resultant photo-cured product was evaluated for its physical properties by being subjected to measurements to be described below.
(5-1) Mold Release Force Measurement
A force needed for mold release was measured with a load cell. When the measurement was actually performed, the mold release force measurement was performed three times under the same conditions and then an average was calculated from data in the respective measurements. As a result of the measurement, the average mold release force was 48.0 N, which was a value lower than that of a photo-cured product produced from a photocurable composition (b-1) in Comparative Example 1 to be described later.

Example 2

A photocurable composition (a-2) was prepared by the same method as that of Example 1 with the exception that in Example 1, 2.0 parts by weight of a surfactant FTERGENT 250 (manufactured by Neos) represented by the following formula (C-2) were used instead of the surfactant represented by the formula (C-1) as the component (C).

(C-2)

(Measurement of Surface Tension of Resist (Photocurable composition))

The surface tension of the photocurable composition (a-2) measured by the same method as that of Example 1 was 31.1 mN/m. The value was higher than that of the photocurable composition (b-2) prepared in Comparative Example 2 to be described later.

(Measurement of Contact Angle of Resist (Photocurable Composition))

The contact angle of the photocurable composition (a-2) with respect to the top of a quartz substrate measured by the same method as that of Example 1 was 12.8°. The value was lower than that of the photocurable composition (b-2) prepared in Comparative Example 2 to be described later.

(Evaluation for Water Contact Angle of Photo-Cured Film)

The photocurable composition (a-2) was applied onto a silicon wafer by a spin coating method to form a film having a thickness of about 1 μm. Next, the film of the photocurable composition (a-2) was irradiated with light under a nitrogen atmosphere to provide a photo-cured film. It is to be noted that a UV light source EX250 (manufactured by HOYA CANDEO OPTRONICS CORPORATION) provided with a 250-W ultra-high pressure mercury lamp was used as a light source. In addition, at the time of the irradiation with light, an illumination intensity on the film was adjusted to 25 mW/cm$^2$ at a wavelength of 365 nm through an interference filter (VPF-50C-10-25-36500, manufactured by SIGMA KOKI CO., LTD.) between the light source and the film, and a light irradiation time was set to 100 seconds. Next, a water contact angle when 1 μl of pure water was dropped on the film obtained by curing the photocurable composition (a-2) was measured with a fully automatic contact angle meter (CA-W, manufactured by Kyowa Interface Science Co., Ltd.). As a result of the measurement, the water contact angle was 26.2°.

(Production of Photo-Cured Product)

A photo-cured product was obtained by the same method as that of Example 1 with the exception that in Example 1, the photocurable composition (a-2) was used instead of the photocurable composition (a-1).

(Mold Release Force Measurement)

The average mold release force of a photo-cured product obtained from the photocurable composition (a-2) was measured by the same method as that of Example 1. As a result, the average mold release force was 46.8 N. The value was lower than that of the photo-cured product produced from the photocurable composition (b-1) in Comparative Example 1 to be described later.

Example 3

A photocurable composition (a-3) was prepared by the same method as that of Example 1 with the exception that in Example 1, the component (B) was changed to 3 parts by weight of an Irgacure 651 (manufactured by Ciba Japan) alone.

(Measurement of Surface Tension of Resist (Photocurable Composition))

The surface tension of the photocurable composition (a-3) measured by the same method as that of Example 1 was 31.1 mN/m. The value was higher than that of the photocurable composition (b-3) prepared in Comparative Example 3 to be described later.

(Measurement of Contact Angle of Resist (Photocurable Composition))

The contact angle of the photocurable composition (a-3) with respect to the top of a quartz substrate measured by the same method as that of Example 1 was 8.6°. The value was lower than that of the photocurable composition (b-3) prepared in Comparative Example 3 to be described later.

(Production of Photo-Cured Film by Spin Coating and Measurement of Water Contact Angle with Respect to the Photo-Cured Film)

The photo-cured film of the photocurable composition (a-3) was produced and then its water contact angle was measured in the same manner as in Example 2. As a result, the water contact angle was 6.2°.

(Production of Photo-Cured Product)

A photo-cured product was obtained by the same method as that of Example 1 with the exception that in Example 1, the photocurable composition (a-3) was used instead of the photocurable composition (a-1).

(Mold Release Force Measurement)

The average mold release force of a photo-cured product obtained from the photocurable composition (a-3) was measured by the same method as that of Example 1. As a result, the average mold release force was 45.7 N. The value was lower than that of the photo-cured product produced from the photocurable composition (b-4) in Comparative Example 4 to be described later.

Example 4

A photocurable composition (a-4) was prepared by the same method as that of Example 3 with the exception that in Example 3, a surfactant FTERGENT 222F (manufactured by Neos) represented by the following formula (C-3) was used as the component (C).

(C-3)

(Measurement of Surface Tension of Resist (Photocurable Composition))

The surface tension of the photocurable composition (a-4) measured by the same method as that of Example 1 was 28.2 mN/m. The value was higher than that of the photocurable composition (b-3) prepared in Comparative Example 3 to be described later.

(Measurement of Contact Angle of Resist (Photocurable Composition))

The contact angle of the photocurable composition (a-3) with respect to the top of a quartz substrate measured by the same method as that of Example 1 was 22.8°.

(Production of Photo-Cured Product)

A photo-cured product was obtained by the same method as that of Example 1 with the exception that in Example 1, the photocurable composition (a-4) was used instead of the photocurable composition (a-1).

(Mold Release Force Measurement)

The average mold release force of a photo-cured product obtained from the photocurable composition (a-4) was measured by the same method as that of Example 1. As a result, the average mold release force was 46.1N. The value was lower than that of the photo-cured product produced from the photocurable composition (b-4) in Comparative Example 4 to be described later.

Example 5

A photocurable composition (a-5) was prepared by the same method as that of Example 3 with the exception that in Example 3, the component (C) was changed to 1 part by weight of the compound represented by the formula (C-2) alone.
(Measurement of Surface Tension of Resist (Photocurable Composition))
The surface tension of the photocurable composition (a-5) measured by the same method as that of Example 1 was 30.8 mN/m. The value was higher than that of the photocurable composition (b-3) prepared in Comparative Example 3 to be described later.
(Measurement of Contact Angle of Resist (Photocurable Composition))
The contact angle of the photocurable composition (a-5) with respect to the top of a quartz substrate measured by the same method as that of Example 1 was 5.3°. The value was lower than that of the photocurable composition (b-3) prepared in Comparative Example 3 to be described later.
(Production of Photo-Cured Product)
A photo-cured product was obtained by the same method as that of Example 1 with the exception that in Example 1, the photocurable composition (a-5) was used instead of the photocurable composition (a-1).
(Mold Release Force Measurement)
The average mold release force of a photo-cured product obtained from the photocurable composition (a-4) was measured by the same method as that of Example 1. As a result, the average mold release force was 46.3 N. The value was lower than that of the photo-cured product produced from the photocurable composition (b-4) in Comparative Example 4 to be described later.

Comparative Example 1

The photocurable composition (b-1) was prepared by the same method as that of Example 1 with the exception that in Example 1, the component (C) (surfactant) was not added.
(Measurement of Surface Tension of Resist (Photocurable Composition))
The surface tension of the photocurable composition (b-1) measured by the same method as that of Example 1 was 30.7 mN/m.
(Measurement of Contact Angle of Resist (Photocurable Composition))
The contact angle of the photocurable composition (b-1) with respect to the top of a quartz substrate measured by the same method as that of Example 1 was 3.6°.
(Production of Photo-Cured Product)
A photo-cured product was obtained by the same method as that of Example 1 with the exception that in Example 1, the photocurable composition (b-1) was used instead of the photocurable composition (a-1).
(Mold Release Force Measurement)
The average mold release force of a photo-cured product obtained from the photocurable composition (b-1) was measured by the same method as that of Example 1. As a result, the average mold release force was 49.8 N.

Comparative Example 2

In Example 1, 1.1 parts by weight of pentadecaethylene glycol mono(1H,1H,2H,2H-perfluorooctyl)ether (manufactured by DIC Corporation) shown below were added instead of the compound represented by the formula (C-1) as the component (C) (surfactant).

$F(CF_2)_6CH_2CH_2(OCH_2CH_2)_{15}OH$

The photocurable composition (b-2) was prepared by the same method as that of Example 1 except the foregoing.
(Measurement of Surface Tension of Resist (Photocurable Composition))
The surface tension of the photocurable composition (b-2) measured by the same method as that of Example 1 was 24.0 mN/m.
(Measurement of Contact Angle of Resist (Photocurable Composition))
The contact angle of the photocurable composition (b-2) with respect to the top of a quartz substrate measured by the same method as that of Example 1 was 20.3°.
(Production of Photo-Cured Product)
A photo-cured product was obtained by the same method as that of Example 1 with the exception that in Example 1, the photocurable composition (b-2) was used instead of the photocurable composition (a-1).
(Mold Release Force Measurement)
The average mold release force of a photo-cured product obtained from the photocurable composition (b-2) was measured by the same method as that of Example 1. As a result, the average mold release force was 46.9 N.

Comparative Example 3

In Example 3, 1.1 parts by weight of pentadecaethylene glycol lmono(1H,1H,2H,2H-perfluorooctyl)ether (manufactured by DIC Corporation) shown below were added instead of the compound represented by the formula (C-1) as the component (C) (surfactant).

$F(CF_2)_6CH_2CH_2(OCH_2CH_2)_{15}OH$

The photocurable composition (b-3) was prepared by the same method as that of Example 1 except the foregoing.
(Measurement of Surface Tension of Resist (Photocurable Composition))
The surface tension of the photocurable composition (b-3) measured by the same method as that of Example 1 was 26.1 mN/m.
(Measurement of Contact Angle of Resist (Photocurable Composition))
The contact angle of the photocurable composition (b-3) with respect to the top of a quartz substrate measured by the same method as that of Example 1 was 17.9°.
(Production of Photo-Cured Product)
A photo-cured product was obtained by the same method as that of Example 1 with the exception that in Example 1, the photocurable composition (b-3) was used instead of the photocurable composition (a-1).
(Mold Release Force Measurement)
The average mold release force of a photo-cured product obtained from the photocurable composition (b-3) was measured by the same method as that of Example 1. As a result, the average mold release force was 45.4 N.

Comparative Example 4

The photocurable composition (b-4) was prepared by the same method as that of Example 3 with the exception that in Example 3, the component (C) (surfactant) was not added.

(Measurement of Surface Tension of Resist (Photocurable Composition))

The surface tension of the photocurable composition (b-4) measured by the same method as that of Example 1 was 28.1 mN/m.

(Measurement of Contact Angle of Resist (Photocurable Composition))

The contact angle of the photocurable composition (b-4) with respect to the top of a quartz substrate measured by the same method as that of Example 1 was 3.6°.

(Production of Photo-Cured Film by Spin Coating and Measurement of Water Contact Angle with Respect to the Photo-Cured Film)

The photo-cured film of the photocurable composition (b-4) was produced and then its water contact angle was measured in the same manner as in Example 2. As a result, the water contact angle was 93.5°.

(Production of Photo-Cured Product)

A photo-cured product was obtained by the same method as that of Example 1 with the exception that in Example 1, the photocurable composition (b-4) was used instead of the photocurable composition (a-1).

(Mold Release Force Measurement)

The average mold release force of a photo-cured product obtained from the photocurable composition (b-4) was measured by the same method as that of Example 1. As a result, the average mold release force was 48.3 N.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-205551, filed Sep. 19, 2012, and Japanese Patent Application No. 2013-028701, filed Feb. 18, 2013, which are hereby incorporated by reference herein in their entirety.

The invention claimed is:

1. A method of manufacturing a film, comprising:
a placing step of placing a photocurable composition on a substrate;
a mold contact step of bringing the photocurable composition and a mold into contact with each other;
a light irradiation step of irradiating the photocurable composition with light;
a mold release step of releasing a cured product of the photocurable composition and the mold from each other after the light irradiation step; and
a residual film removal step of removing a film remaining in a recessed portion of the cured product by etching after the mold release step to expose a surface of the substrate,
wherein the photocurable composition comprises:
a polymerizable compound, wherein the polymerizable compound comprises (2-methyl-2-ethyl-1,3-dioxolan-4-yl)methyl acrylate and at least one selected from the group consisting of isobornyl acrylate and hexanediol diacrylate;
a photopolymerization initiator; and
a surfactant represented by one of the general formulae (2) and (3):

(2)

(3)

wherein, in the general formula (2) and (3), n represents an integer of 1 or more.

2. The method according to claim 1, wherein a surface of the mold in contact with the photocurable composition comprises quartz.

3. The method according to claim 1, wherein:
the light irradiation step comprises irradiating the photocurable composition with light through the mold; and
the mold has concavo-convex pattern on a surface thereof.

4. A method of manufacturing a substrate with a circuit, comprising performing one of etching and ion implantation based on a pattern shape of a film obtained by the method according to claim 1 to form a circuit structure on the substrate based on the pattern shape.

5. An optical member, comprising:
a substrate; and
a film placed on the substrate,
wherein the film comprises a film manufactured by the method according to claim 1.

6. The method according to claim 1, wherein the photocurable composition has a surface tension at 23° C. of 5 mN/m to 70 mN/m in a mixture of components except a solvent.

7. The method according to claim 1, wherein the photopolymerization initiator is a photoradical generator.

8. The method according to claim 1, wherein the placing step comprises placing the photocurable composition on the substrate by an ink jet method.

9. The method according to claim 1, wherein the polymerization initiator comprises 2,2-dimethoxy-2-phenylacetophenone.

10. A film manufactured by the method according to claim 1, wherein a surface of the film has a water contact angle of 74° or less.

* * * * *